United States Patent
Tada et al.

(10) Patent No.: US 8,519,501 B2
(45) Date of Patent: Aug. 27, 2013

(54) SEMICONDUCTOR LIGHT DETECTING ELEMENT WITH GROOVED SUBSTRATE

(75) Inventors: Hitoshi Tada, Tokyo (JP); Yasuo Nakajima, Tokyo (JP); Yasuhiro Kunitsugu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/477,128

(22) Filed: May 22, 2012

(65) Prior Publication Data

US 2013/0062718 A1    Mar. 14, 2013

(30) Foreign Application Priority Data

Sep. 9, 2011    (JP) ................. 2011-196694

(51) Int. Cl.
*H01L 31/0232* (2006.01)

(52) U.S. Cl.
USPC ................. 257/432; 257/E31.128

(58) Field of Classification Search
USPC ............... 257/440, 432, 433, 434, 435, 632, 257/791, E31.128
See application file for complete search history.

(56) References Cited

U.S. PATENT DOCUMENTS

| 6,784,512 B2 * | 8/2004 | Kuhara et al. ........... 257/440 |
| 7,667,400 B1 * | 2/2010 | Goushcha ............... 313/532 |
| 2003/0178636 A1 * | 9/2003 | Kwan et al. ............ 257/186 |

FOREIGN PATENT DOCUMENTS

| JP | 5-267708 A | 10/1993 |
| JP | 2008-270679 A | 11/2008 |

* cited by examiner

*Primary Examiner* — Bilkis Jahan
(74) *Attorney, Agent, or Firm* — Leydig, Voit & Mayer, Ltd.

(57) ABSTRACT

A back-surface-incidence semiconductor light element includes: a semiconductor substrate of a first conductivity type; a first semiconductor layer of a first conductivity type on the semiconductor substrate; a light absorbing layer on the first semiconductor layer; a second semiconductor layer on the light absorbing layer; and an impurity diffusion region of a second conductivity type in a portion of the second semiconductor layer. A region including a p-n junction between the first semiconductor layer and the impurity diffusion region, and extending through the light absorbing layer, is a light detecting portion that detects light incident on a back surface of the semiconductor substrate. A groove in the back surface of the semiconductor substrate surrounds the light detecting portion, as viewed in plan.

5 Claims, 5 Drawing Sheets

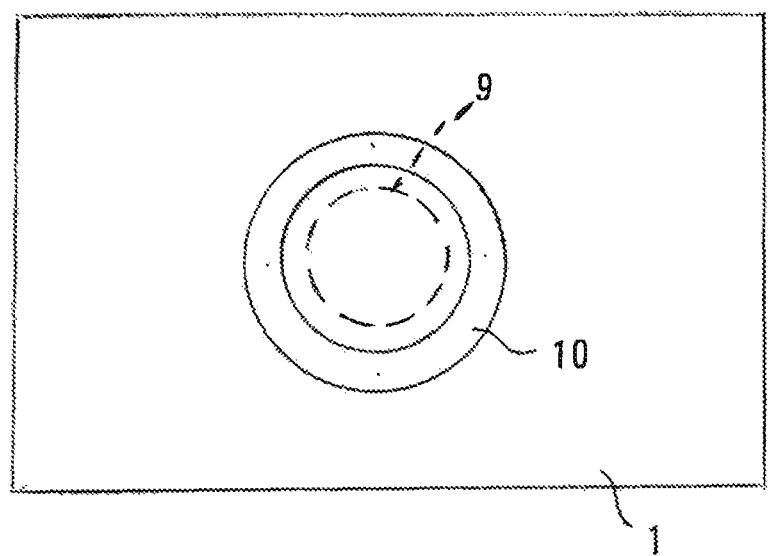

SEMICONDUCTOR LIGHT DETECTING ELEMENT WITH GROOVED SUBSTRATE

BACKGROUND OF THE INVENTION

The present invention relates to a back-surface-incidence-type semiconductor light receiving element that receives light incident on the back surface of a semiconductor substrate.

BACKGROUND ART

With the increase in amount of information in communications in recent years, schemes to develop optical transmission systems having higher capacities through higher transmission speeds using semiconductor lasers and optical fibers have been pursued. There is also a strong demand for increasing the response speed of semiconductor light receiving elements used in optical transmission systems. It is necessary that semiconductor light receiving elements used in optical transmission systems absorb incident light in the 1.3 μm or 1.55 μm band. Therefore, p-i-n photodiodes in which an InP substrate is used are ordinarily used as semiconductor light receiving elements in optical transmission systems.

In improving the response speed of a p-i-n photodiode, it is effective to reduce the capacitance of the element by reducing the area of the light receiving portion (p-n junction). For example, enabling operation at 40 Gbits/sec requires reducing the diameter of the light receiving portion to about 10 μm.

A front-surface-incidence-type p-i-n photodiode, however, is lower in efficiency due to blocking of incident light by an electrode provided on the element surface. It is, therefore, difficult to reduce the diameter of the light receiving portion of this type of photodiode. Therefore, a back-surface-incidence-type photodiode unsusceptible to the influence of the electrode even when the diameter of the light receiving portion is reduced is suitable for a system that needs to be capable of response at a high speed of 10 Gbits/sec or higher.

However, it is becoming difficult to make even a back-surface-incidence-type photodiode capable of response at a high speed of 40 Gbits/sec or higher probably needed in future. Thickening the light absorbing layer for the purpose of reducing the capacitance is conceivable. However, the time during which electrons and positive holes produced in the light absorbing layer move in the light absorbing layer is increased, resulting in degradation in response characteristics. As a solution to this problem, a technique for collecting light with a collective lens provided outside a light receiving element and causing the light to enter the light receiving element has been proposed (see, for example, Japanese Patent Laid-Open No. 2008-270679).

SUMMARY OF THE INVENTION

If the semiconductor substrate is reduced in thickness when a back-surface-incidence-type semiconductor light receiving element is manufactured, the strength of the semiconductor substrate is reduced so that a crack can be caused in the substrate in the manufacturing process. Considering this, it is necessary to set the thickness of the semiconductor substrate to about 100 μm. Therefore, even if light is collected with a collective lens, incident light is scattered in the thick semiconductor substrate, resulting in a reduction in efficiency. With the reduction in light receiving area for the purpose of increasing the response speed, it becomes more important to consider scattering of light in the semiconductor substrate.

In view of the above-described problems, an object of the present invention is to provide a back-surface-incidence-type semiconductor light receiving element which can improve the response speed and the efficiency.

According to the present invention, a back-surface-incidence-type semiconductor light receiving element comprises: a semiconductor substrate of a first conductivity type; a first semiconductor layer of a first conductivity type on the semiconductor substrate; a light absorbing layer on the first semiconductor layer; a second semiconductor layer on the light absorbing layer; and an impurity diffusion region of a second conductivity type in a portion of the second semiconductor layer, wherein a portion in which a p-n junction is provided between the first semiconductor layer and the impurity diffusion region through the light absorbing layer is a light receiving portion that receives incident light on a back surface of the semiconductor substrate, and a groove is provided in the back surface of the semiconductor substrate so as to surround the light receiving portion as viewed in plan.

The present invention makes it possible to improve the response speed and the efficiency.

Other and further objects, features and advantages of the invention will appear more fully from the following description.

DETAILED DESCRIPTION OF THE PREFERRED EMBODIMENTS

A back-surface-incidence-type semiconductor light receiving element according to the embodiments of the present invention will be described with reference to the drawings. The same components will be denoted by the same symbols, and the repeated description thereof may be omitted.

First Embodiment

Figure 1:
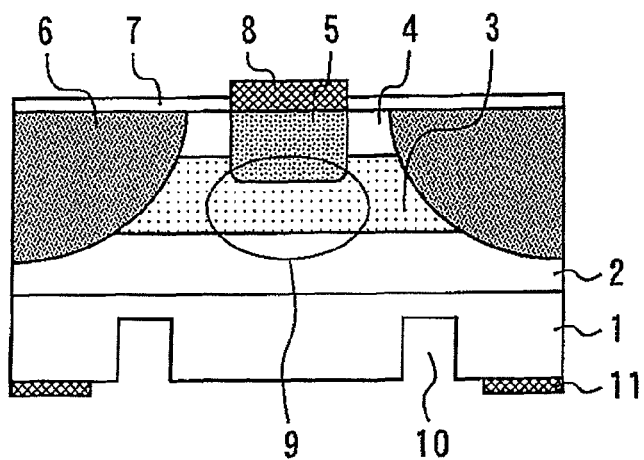
FIG. 1 is a sectional view of a back-surface-incidence-type semiconductor light receiving element according to a first embodiment of the present invention.

FIG. 1 is a sectional view of a back-surface-incidence-type semiconductor light receiving element according to a first embodiment of the present invention. An n-type InP layer 2, an InGaAs light absorbing layer 3, an undoped InP layer 4 are successively provided on an n-type InP substrate 1.

A p-type impurity diffusion region 5 doped with Zn is provided in a portion of the undoped InP layer 4. An InP buried layer 6 is provided on opposite sides of the p-type impurity diffusion region 5. An SiN film 7 is provided on the undoped InP layer 4 and the InP buried layer 6. An opening is formed in the SiN film 7 above the p-type impurity diffusion region 5. A p-side ohmic electrode 8 is provided through this opening on the p-type impurity diffusion region 5.

A portion in which a p-n junction is formed between the n-type InP layer 2 and the p-type impurity diffusion region 5 through the InGaAs light absorbing layer 3 is a light receiving portion 9 that receives light incident on the back surface of the n-type InP substrate 1. A groove 10 is provided in the back surface of the n-type InP substrate 1 so as to surround the light receiving portion 9 as viewed in plan.

An n-side ohmic electrode 11 is provided on the back surface of the n-type InP substrate 1. The n-side ohmic electrode 11 has an opening containing the light receiving portion 9 as viewed in plan. The groove 10 is provided in the opening of the n-side ohmic electrode 11.

Figure 2:
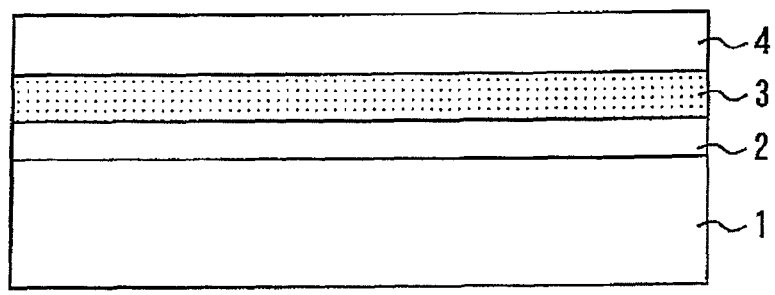
FIGS. 2-7 show process steps of manufacturing the back-surface-incidence-type semiconductor light receiving element according to the first embodiment.

A method of manufacturing the back-surface-incidence-type semiconductor light receiving element according to the first embodiment will be described. First, as shown in FIG. 2, the n-type InP layer 2, the InGaAs light absorbing layer 3 and the undoped InP layer 4 are successively grown on the n-type InP substrate 1.

Figure 3:
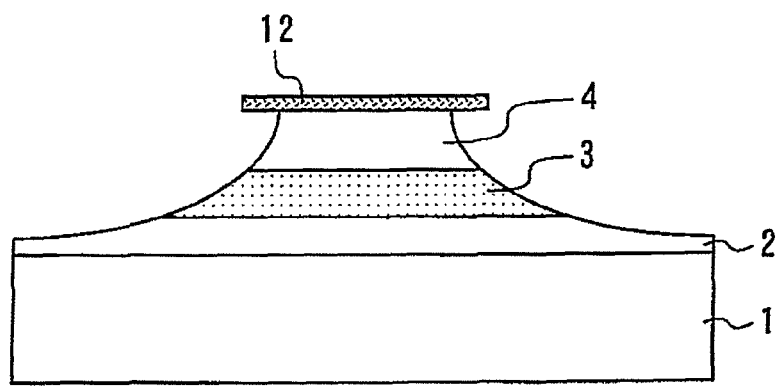

Next, as shown in FIG. 3, an $SiO_2$ film 12 in the form of a disk having a diameter of 20 μm (film thickness: 200 nm) is formed on the undoped InP layer 4 so as to cover the light receiving portion 9. Portions of the layers from the surface of the undoped InP layer 4 to an intermediate position in the n-type InP layer 2 are removed by etching using the $SiO_2$ film 12 as a mask. The diameter of the $SiO_2$ film 12 is not limited to 20 μm. A different size of the $SiO_2$ film 12 may be selected as long as the necessary element capacitance can be realized.

Figure 4:
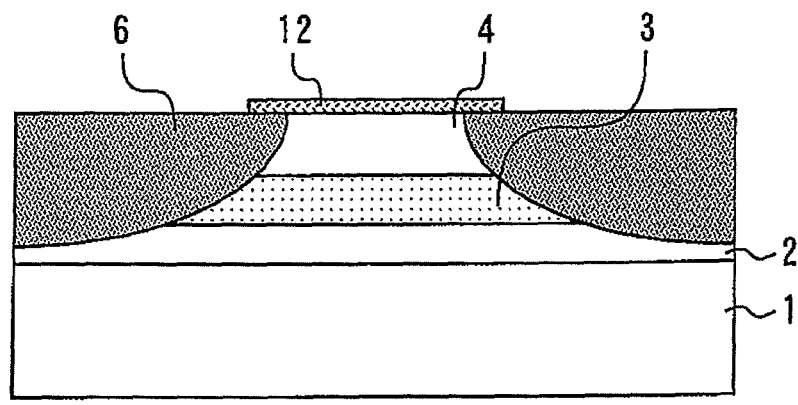

Next, as shown in FIG. 4, the InP buried layer 6 is grown to be buried. It is desirable that the InP buried layer 6 have a high resistance. However, it is difficult to grow an InP layer having an insulating property. Therefore the InP layer is doped with Fe or Ru, for example.

Figure 5:
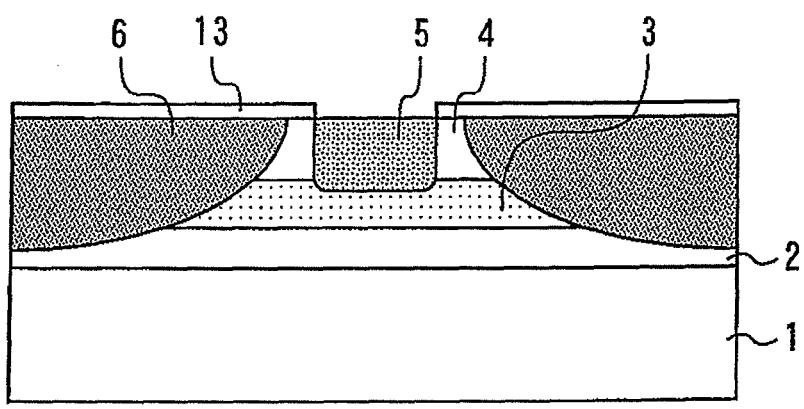

Next, as shown in FIG. 5, the $SiO_2$ film 12 is removed and an $SiO_2$ film 13 is formed on the wafer surface. An opening is formed in the $SiO_2$ film 13 at the light receiving portion 9. A ZnO film that serves as a diffusion source is formed on the $SiO_2$ film 13 and Zn is diffused in circular form with a diameter of 10 μm from the wafer surface to the light receiving portion 9. Thermal diffusion processing is performed to form the p-type impurity diffusion region 5. Zn diffusion is performed until the diffusion front reaches a position in the InGaAs light absorbing layer 3.

Figure 6:
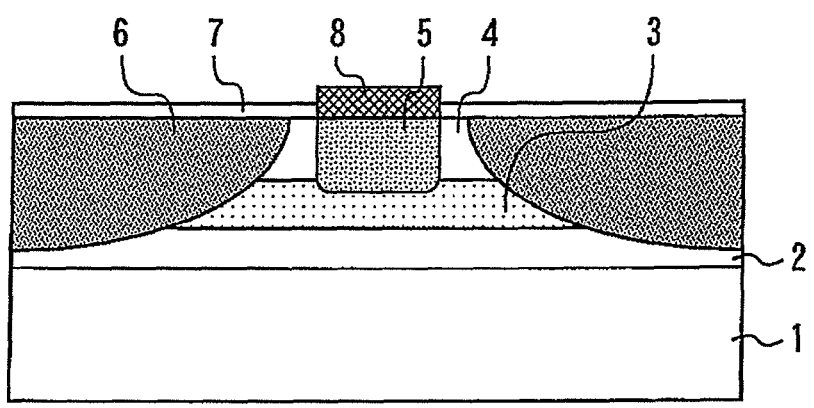
Figure 7A:
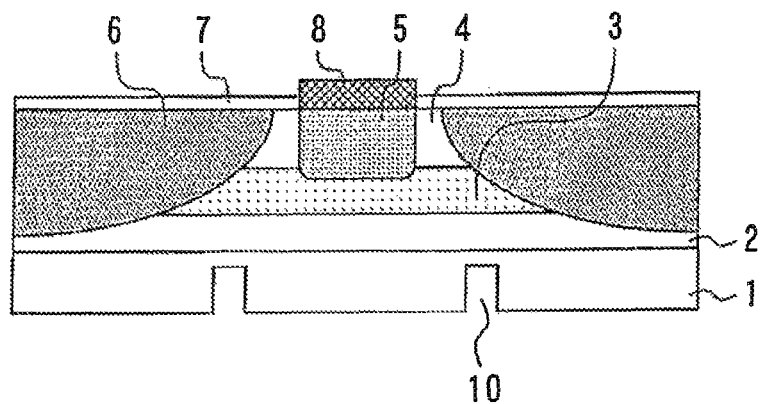

Next, as shown in FIG. 6, the SiN film 7 is formed as a surface protective film on the wafer surface after removal of the $SiO_2$ film 13 and the ZnO film. The p-side ohmic electrode 8 is formed on the p-type impurity diffusion region 5. A contact layer of InGaAsP, InGaAs or the like having a bandgap smaller than that of InP may be provided on the undoped InP layer 4. Also, part of the SiN film 7 may exist between the p-side ohmic electrode 8 and a semiconductor layer. Next, as shown in FIG. 7, the thickness of the n-type InP substrate 1 is reduced to about 100 μm. The groove 10 is formed by etching in the back surface of the n-type InP substrate 1 so as to surround the light receiving portion 9 as viewed in plan. The groove 10 has a diameter of about 50 μm width of 10 μm, and a depth of about 10 μm. When the thickness of the n-type InP substrate 1 is 100 μm, the diameter of the groove 10 may be set larger by about 30 to 50 μm than that of the light receiving portion 9.

Finally, as shown in FIG. 1, the n-side ohmic electrode 11 is formed on the back surface of the n-type InP substrate 1. By the above-described processes, the back-surface-incidence-type semiconductor light receiving element according to the present embodiment is manufactured.

The effects of the present embodiment will be described. Incident light is sent from an optical fiber or an optical waveguide placed at a distance of several ten to several hundred μm from the light receiving element and therefore includes not only light perpendicularly incident on the back surface of the n-type InP substrate 1 but also light obliquely incident on the back surface. In the present embodiment, the groove 10 is provided in the back surface of the n-type InP substrate 1 so as to surround the light receiving portion 9 as viewed in plan. Obliquely incident light is totally reflected by the groove 10 surrounding the light receiving portion 9 to propagate to the light receiving portion 9 with efficiency. As a result, the amount of incident light reaching the light receiving portion 9 is increased, thus improving the efficiency. This effect can also be obtained in a case where the light receiving area is reduced for the purpose of improving the response speed. Thus, in the present embodiment, the response speed and the efficiency can be improved.

If the depth of the groove 10 is increased, light can be collected more efficiently. It is, therefore, desirable that the groove 10 be provided so as to reach a position near the interface between the n-type InP substrate 1 and the n-type InP layer 2. Since total reflection at the boundary surface between air in the groove 10 and the semiconductor is utilized, the width of the groove 10 is not limited to any particular value.

Second Embodiment

Figure 8:
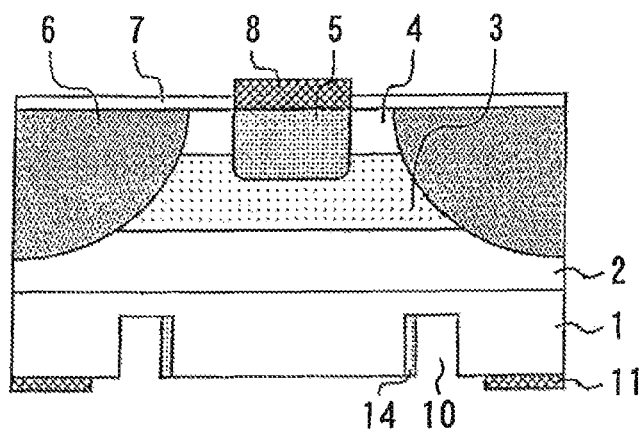
FIG. 8 is a sectional view of a back-surface-incidence-type semiconductor light receiving element according to a second embodiment of the present invention.

FIG. 8 is a sectional view of a back-surface-incidence-type semiconductor light receiving element according to a second embodiment of the present invention. In the first embodiment, total reflection at the boundary surface between air in the groove 10 and the semiconductor is utilized. In the present embodiment, a reflecting film 14 that reflects incident light is provided on side walls of the groove 10.

The reflecting film 14 is, for example, a two-layer film formed of SiN film and Au film. The reflectance at the side walls of the groove 10 can be increased by means of the Au film in the reflecting film 14. Ag, Al, Cu or any other metal or a dielectric multilayer film, for example, may be used in place of the Au film. The SiN film prevents the n-type InP substrate 1 and Au from directly contacting and reacting with each other in an alloying manner. The film thickness d (nm) of the SiN film is set so that if the refractive index of SiN is nr and the wavelength of incident light is λ (nm), d=λ/(4×nr) is satisfied.

Third Embodiment

Figure 9:
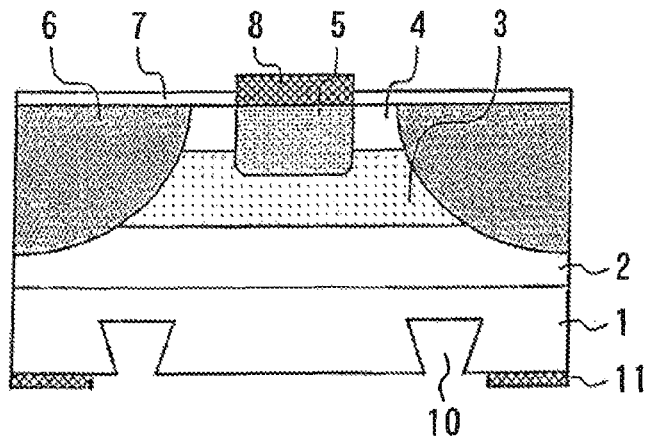
FIG. 9 is a sectional view of a back-surface-incidence-type semiconductor light receiving element according to a third embodiment of the present invention.

FIG. 9 is a sectional view of a back-surface-incidence-type semiconductor light receiving element according to a third embodiment of the present invention. In the present embodiment, the angles between the back surface of the n-type InP substrate 1 and the side walls of the groove 10 are smaller than 90 degrees. Setting the angles in this way enables incident light totally reflected by the side walls of the groove 10 to be led to a central portion of the light receiving portion 9. As a result, the efficiency is further improved in comparison with the first embodiment.

Examples of a method of forming the groove 10 as described above are a method of performing dry etching using an $SiCl_4$/Ar or $Cl_2$/Ar mixture gas and using a resist or an insulating film as an etching mask and a method of performing etching using a solution formed of a mixture of bromine and methanol.

Fourth Embodiment

Figure 10:
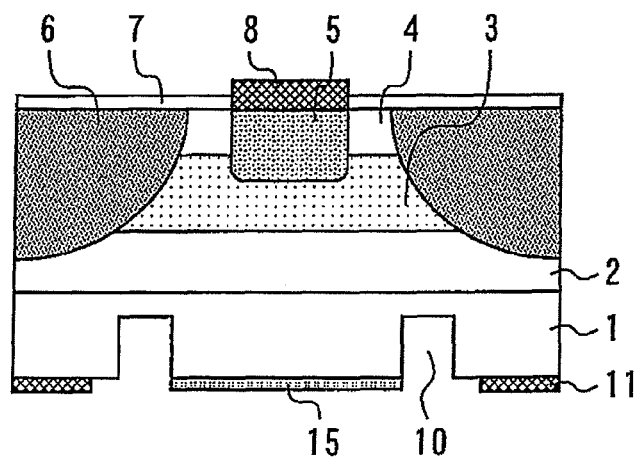
FIG. 10 is a sectional view of a back-surface-incidence-type semiconductor light receiving element according to a fourth embodiment of the present invention.

FIG. 10 is a sectional view of a back-surface-incidence-type semiconductor light receiving element according to a fourth embodiment of the present invention. In the present embodiment, a low-reflection film 15 having a reflectance of 1% or less to incident light having wavelengths in the 1.3 to 1.5 µm band is provided on a light receiving region in the back surface of the n-type InP substrate 1 surrounded by the groove 10.

The low-reflection film 15 is a dielectric film such as SiN film, $SiO_2$ film or $Al_2O_3$ film. The film thickness of the low-reflection film 15 is set to a value expressed by $\lambda/(4 \times nr)$ with respect to a center wavelength $\lambda$ of incident light. In this expression, nr is the refractive index of the low-reflection film 15.

The low-reflection film 15 is provided on the light receiving region in the back surface of the n-type InP substrate 1 to limit reflection at the interface between the semiconductor and air at the back surface of the substrate, thus enabling leading incident light into the semiconductor with efficiency.

Fifth Embodiment

Figure 11:
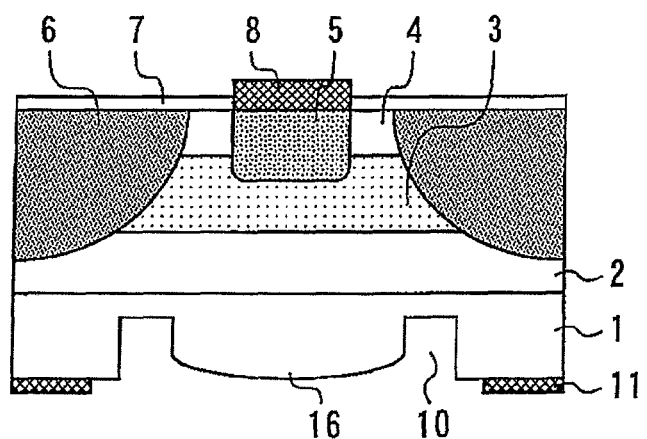
FIG. 11 is a sectional view of a back-surface-incidence-type semiconductor light receiving element according to a fifth embodiment of the present invention.

FIG. 11 is a sectional view of a back-surface-incidence-type semiconductor light receiving element according to a fifth embodiment of the present invention. In the present embodiment, a convex microlens 16 is provided in a light receiving region in the back surface of the n-type InP substrate 1 surrounded by the groove 10. Incident light can be positively taken into the light receiving portion 9 with the microlens 16. Therefore the efficiency can be further improved in comparison with the first embodiment.

In the manufacturing method according to the first embodiment, a resist is formed on the light receiving region after reducing the thickness of the n-type InP substrate 1, and etching is performed by using a solution formed of a mixture of an aqueous bromine solution, hydrogen peroxide and pure water and using the resist as a mask, thereby forming the microlens 16. Alternatively, after forming the resist on the light receiving region, baking at about 200° C. is performed to thermally weaken the resist and sputter-etching is performed until the resist is completely removed, thereby forming the microlens 16.

Sixth Embodiment

Figure 12:
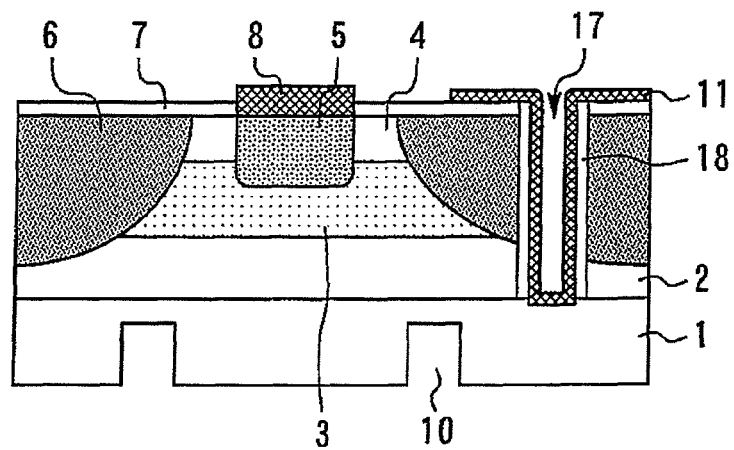
FIG. 12 is a sectional view of a back-surface-incidence-type semiconductor light receiving element according to a sixth embodiment of the present invention.

FIG. 12 is a sectional view of a back-surface-incidence-type semiconductor light receiving element according to a sixth embodiment of the present invention. In the present embodiment, a groove 17 is provided from the element front surface side to the n-type InP substrate 1 or the n-type InP layer 2. Side walls of the groove 17 are covered with an insulating film 18. The n-side ohmic electrode 11 is connected to the n-type InP substrate 1 or the n-type InP layer 2 at the bottom of the groove 10 and extends substantially flush with the p-side ohmic electrode 8.

Both the n-side ohmic electrode 11 and the p-side ohmic electrode 8 can be provided on the wafer front surface side in this way, thereby enabling use of flip-chip bonding. Thus, a reduction in inductance can be achieved in comparison with the case of using ordinary wire bonding, and a high-speed response characteristic can be obtained more easily.

In the above-described first to sixth embodiments, the InGaAs light absorbing layer 3 is used to absorb incident light with wavelengths of 1.3 to 1.55 µm. However, a material capable of absorbing incident light of the necessary wavelength may be used in the light absorbing layer. For example, in a case where incident light with wavelengths in the 1.3 µm band only is to be absorbed, InGaAsP may be used in the light absorbing layer.

In the above-described first to sixth embodiments, a p-i-n photodiode is used. However, the same effect can also be obtained by using an avalanche photodiode (APD).

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-196694, filed on Sep. 9, 2011 including specification, claims, drawings, and summary, on which the Convention priority of the present application is based, is incorporated herein by reference in its entirety.

What is claimed is:

1. A semiconductor light detecting element comprising:
   a semiconductor substrate of a first conductivity type and having opposed front and back surfaces;
   a first semiconductor layer of the first conductivity type on the front surface of the semiconductor substrate;
   a light absorbing layer on the first semiconductor layer;
   a second semiconductor layer on the light absorbing layer and comprising an impurity region of a second conductivity type having an interface with the light absorbing layer, wherein
      the impurity region forms a p-i-n structure with the first semiconductor layer and a part of the light absorbing layer that is disposed between the impurity region and the first semiconductor layer, the p-i-n structure defining a light-detecting region,
      light incident on the back surface of the semiconductor substrate and reaching the light detecting region is detected by the light detecting element, and
      the semiconductor substrate includes an air-filled groove having side walls, wherein
         the air-filled groove extends into the semiconductor substrate from the back surface of the semiconductor substrate, and surrounds the light-detecting region, when the semiconductor substrate in viewed in plan, perpendicular to the back surface, and the light-detecting region is projected onto the back surface of the semiconductor substrate, and
         the side walls reflect light obliquely incident on the back surface of the semiconductor substrate toward the light-detecting region; and
   a reflecting film, reflecting light that is incident on the back surface of the semiconductor substrate toward the light-detecting region, wherein the reflecting film is located on one of the side walls of the air-filled groove.

2. A semiconductor light detecting element comprising:
   a semiconductor substrate of a first conductivity type and having opposed front and back surfaces;
   a first semiconductor layer of the first conductivity type on the front surface of the semiconductor substrate;
   a light absorbing layer on the first semiconductor layer;
   a second semiconductor layer on the light absorbing layer and comprising an impurity region of a second conductivity type having an interface with the light absorbing layer, wherein the impurity region forms a p-i-n structure with the first semiconductor layer and a part of the light absorbing layer that is disposed between the impurity region and the first semiconductor layer, the p-i-n structure defining a light-detection region, light incident on the back surface of the semiconductor substrate and reaching the light-detecting region is detected by the light detecting element, and the semiconductor substrate includes an air-filled groove having side walls, wherein the air-filled groove extends into the semiconductor substrate from the back surface of the semiconductor substrate, and surrounds the light-detecting region, when the semiconductor substrate in viewed in plan, perpendicular to the back surface, and the light-detecting region is projected onto the back surface of the semiconductor substrate, and the side walls reflect light obliquely incident on the back surface of the semiconductor substrate toward the light-detection region.

3. The semiconductor light detecting element according to claim 2, wherein the air-filled groove extends into the semiconductor substrate to a position near an interface between the semiconductor substrate and the first semiconductor layer.

4. The semiconductor light detecting element according to claim 2, wherein the back surface of the semiconductor substrate and the side walls of the air-filled groove, when viewed in a cross-section that is transverse to the front and back surfaces, form an angle smaller than 90 degrees.

5. The semiconductor light detecting element of claim 2, wherein the side walls are transverse to the back surface of the semiconductor substrate when viewed in a cross-section that is transverse to the front and back surfaces.

* * * * *